United States Patent [19]

Kristensen

[11] Patent Number: 5,406,442
[45] Date of Patent: Apr. 11, 1995

[54] SOLID STATE RELAY

[75] Inventor: Ove S. Kristensen, Hadsten, Denmark

[73] Assignee: Carlo Gavazzi AG, Steinhausen, Switzerland

[21] Appl. No.: 119,280

[22] Filed: Sep. 10, 1993

[30] Foreign Application Priority Data

Jan. 26, 1993 [DE] Germany ............... 93 01 023.0 U

[51] Int. Cl.⁶ .............................................. H01H 9/30
[52] U.S. Cl. .................................... 361/187; 361/98; 361/90; 361/13; 361/3
[58] Field of Search ............... 361/64, 68, 76, 87, 361/33, 67, 18, 13, 187, 90–92, 86, 2–7; 307/632, 630, 633, 357, 311, 639–640; 323/300, 265, 274–277

[56] References Cited

U.S. PATENT DOCUMENTS

| | | | |
|---|---|---|---|
| 4,270,058 | 5/1981 | Schornack | 307/140 |
| 4,350,949 | 9/1982 | Fujita | 323/284 |
| 4,538,195 | 8/1985 | Elmore | 361/64 |
| 4,578,596 | 5/1986 | Tihanyi et al. | 307/252 R |
| 4,745,311 | 5/1988 | Iwasaki | 307/632 |
| 4,924,343 | 5/1990 | Niemi | 361/98 |
| 5,283,706 | 2/1994 | Lilleno et al. | 361/3 |

Primary Examiner—Marc S. Hoff
Assistant Examiner—Aditya Krishnan
Attorney, Agent, or Firm—Nields & Lemack

[57] ABSTRACT

A solid state relay having circuitry incorporated therein which senses line conditions and load conditions and activates an alarm when a fault is detected.

15 Claims, 9 Drawing Sheets

SOLID STATE RELAY

BACKGROUND OF THE INVENTION

1. Field of the Invention

This invention relates to solid state relays, which are commonly used for driving ac loads.

2. Description of Related Art

Previous types of solid state relays will act only as a switch, and any monitoring of line conditions or load conditions must be done externally.

SUMMARY OF THE INVENTION

The solid state relay according to the invention is a solid state relay which on its own, can monitor if line voltage is present and that the load circuit has not been interrupted. If the operating conditions are not satisfactory an alarm output will be activated. The invention permits the elimination of the external monitoring circuit to be able to downsize the complete circuit.

This invention is a line-load monitoring solid-state relay which will detect if a voltage is present at the voltage source and that the load circuit has not been interrupted by, for instance, a burned-out incandescent lamp or a burned-out heater.

The sensing elements comprise optical insulators, thereby providing, at the same time, the required electrical insulation between control and line/load side. An optical insulator is also known as an "opto-coupler" or "opto-isolator", and may comprise an LED emitter, combined with a photodetector in close proximity. The invention also comprehends providing the required electrical insulation between control and line/load side by the use of magnetically coupled insulators in lieu of optical insulators. Such magnetically coupled insulators may comprehend, for example, transformer insulation or reed-relay insulation.

BRIEF DESCRIPTION OF THE DRAWINGS

The invention may best be understood from the following detailed description thereof, having reference to the accompanying drawings, in which.

DESCRIPTION OF THE PREFERRED EMBODIMENTS

Figure 1:
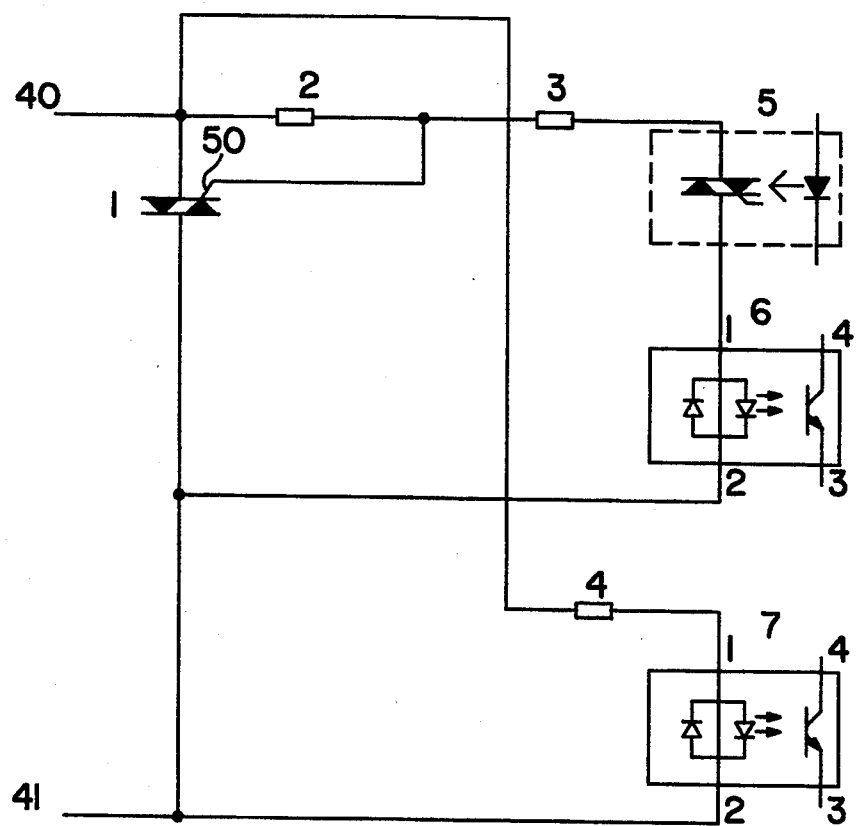
FIG. 1 is a circuit diagram showing an example of an output circuit useful in this invention.

Referring to the drawings, and first to FIG. 1 thereof, therein is shown an example of an output circuit useful in this invention. The function of the circuit in this example will now be explained.

Figure 4:
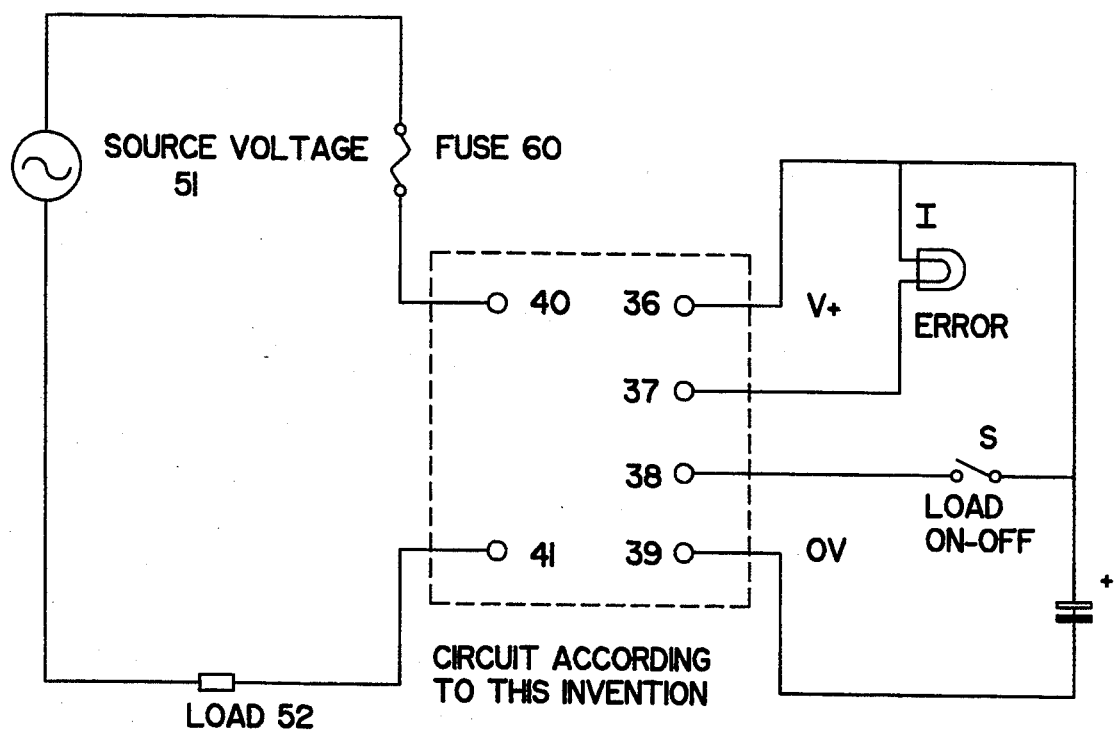
FIG. 4 is a circuit diagram showing an application example for this invention.

The control terminal 50 of a bidirectional power switch 1 is connected to one side of an optically insulated bidirectional switch 5 through a current limiting device 3. The other side of said optically insulated switch 5 is connected through the input of an optical insulator 6 to one power output terminal 41, thus enabling a current, flowing from the other output power terminal 40 through components 2, 3, and 6 and controlled by component 5 to change the status of the bidirectional power switch 1. That is to say, if the optically insulated switch 5 is closed, the current through the resistor 2 imparts the voltage difference between the control terminal 50 and the rest of the power output switch 1 which is needed to close the bidirectional power switch 1; if the optically insulated switch 5 is open, no current flows through the resistor 2, and so there is no voltage difference between the control terminal 50 and the rest of the power output switch 1, thereby opening the power output switch 1. The environment of the power terminals 40 and 41 is shown in FIG. 4, from which it may be seen that the bidirectional power switch 1 determines whether or not under normal operating conditions current flows from the source voltage 51 through the load 52.

When the bidirectional switch 5 is closed, not only does this cause the closing of the power output switch 1, but it also causes the activation of the optical insulator 6. In other words, the "control current" through the components 2,3,5 and 6 will activate the optical insulator 6 only when the output power switch 1 is in the conducting state.

A second optical insulator 7 is connected, in series with a resistor 4, across the output terminals 40,41 in parallel with the power switch 1. When the power switch 1 is closed, under normal operating conditions there is essentially no voltage across the output terminals 40,41 and hence no current through the resistor 4 and optical insulator 7. When the power switch 1 is open, a voltage is present across the output switch 1 (i.e. across the output terminals 40,41). The second optical insulator 7 will be activated when a voltage is present across the output switch 1 by the current flowing through the resistor 4.

Figure 2:
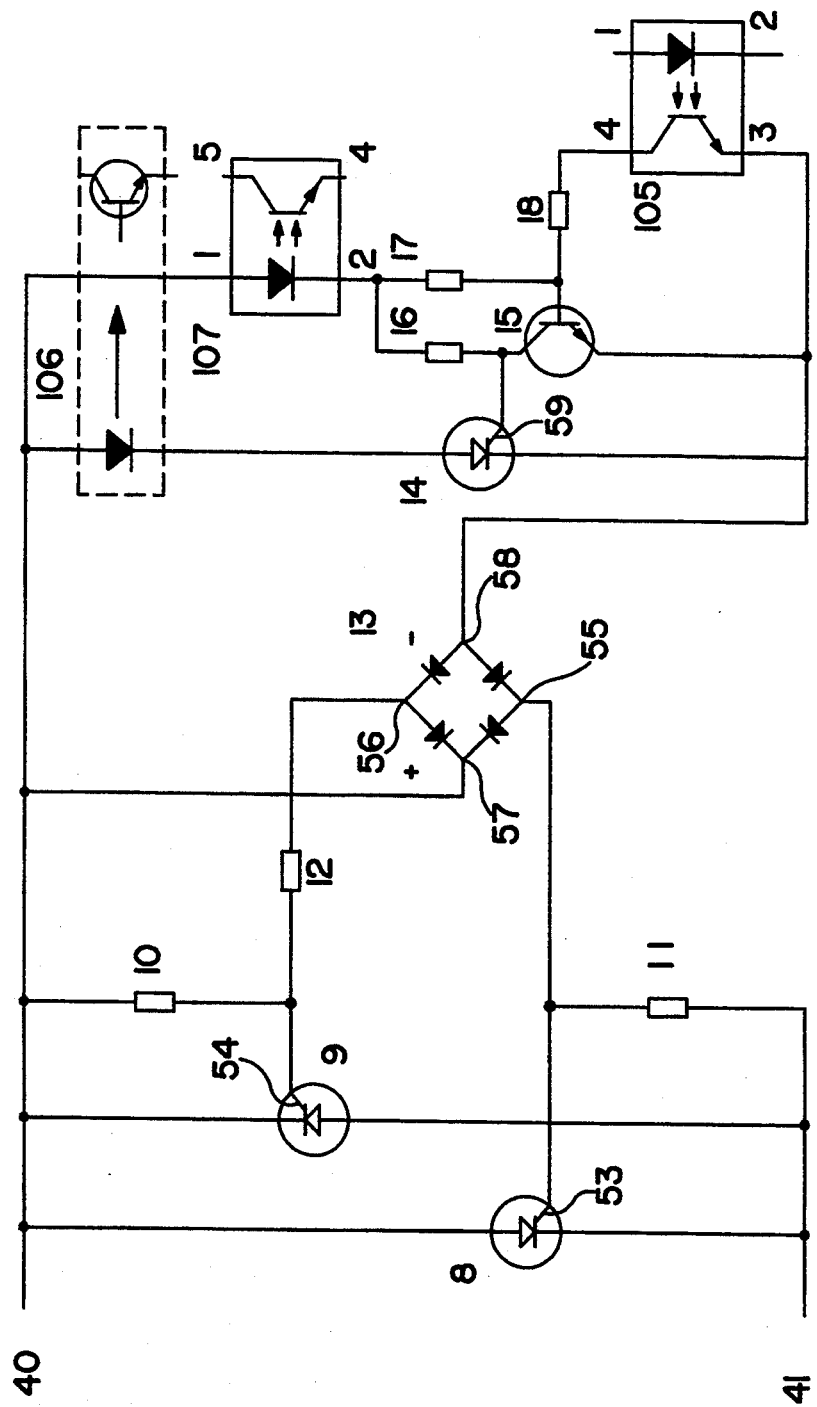
FIG. 2 is a circuit diagram showing another example of an output circuit.

FIG. 2 is a circuit diagram of another example of an output circuit useful in this invention. The circuit in this example will now be explained. The control terminals 53, 54 of two unidirectional power switches 8,9 are connected across the AC terminals 55,56 of a bridge rectifier 13 through a current limiting device 12. A unidirectional switch 14 is connected between the positive terminal 57 and the negative terminal 58 of the bridge rectifier 13 through the input of an optical insulator 106. The control terminal 59 of the unidirectional switch 14 is connected to the positive terminal 57 of the bridge rectifier 13 through a resistor 16 and the input of an optical insulator 107. The collector of a transistor 15 is connected to the control terminal 59 of the unidirectional switch 14, and the emitter of the transistor 15 is connected to the negative terminal 58 of bridge rectifier 13 and to the negative terminal of unidirectional switch 14. The base terminal of transistor 15 is connected to the positive terminal 57 of bridge rectifier 13 through a resistor 17 and the input of optical insulator 107. The base terminal of transistor 15 is also connected to the positive output terminal of an optical switch 105 through a resistor 18. The negative output terminal of optical switch 105 is connected to the negative terminal 58 of bridge rectifier 13.

Let it be assumed that a voltage is present across output terminals 40,41 (i.e., the power switch 1 is open). This voltage will be rectified by bridge rectifier 13 and appear as a DC voltage on the inputs of optical switches 106 and 107. Because of the resistors 16 and 17, the said DC voltage will produce a DC current flowing through optical switch 107 into the collector and base, respectively, of transistor 15, and optical switch 107 will be activated. If optical switch 105 is activated under said conditions, the current flowing in current limiting device 17 will flow into the output terminal of optical switch 105 through current limiting device 18 instead of into the base terminal of transistor 15. Under these conditions the current in resistor 16 will flow into the control terminal 59 of unidirectional switch 14 instead of into the collector of transistor 15, thus activating unidirectional switch 14. The said switch 14 will start to conduct current through optical switch 106 under the pressure of the voltage generated between the positive terminal 57 and the negative terminal 58 of the bridge rectifier 13. In other words, the DC output of the bridge rectifier 13 is now supplying current, whereas with the unidirectional switch 14 open, no such current was supplied. This means that AC current now flows through resistors 10 and 11, impressing voltage of the proper polarity onto control terminals 53 and 54 so as alternately to close each of the unidirectional power switches 8,9. This current through bridge rectifier 13, current limiting device 12, and into the control terminals 53,54 of the unidirectional power switches 8,9 thus activates the power switch which at the moment is in the forward direction with respect to the voltage across output terminals 40,41.

Figure 3:
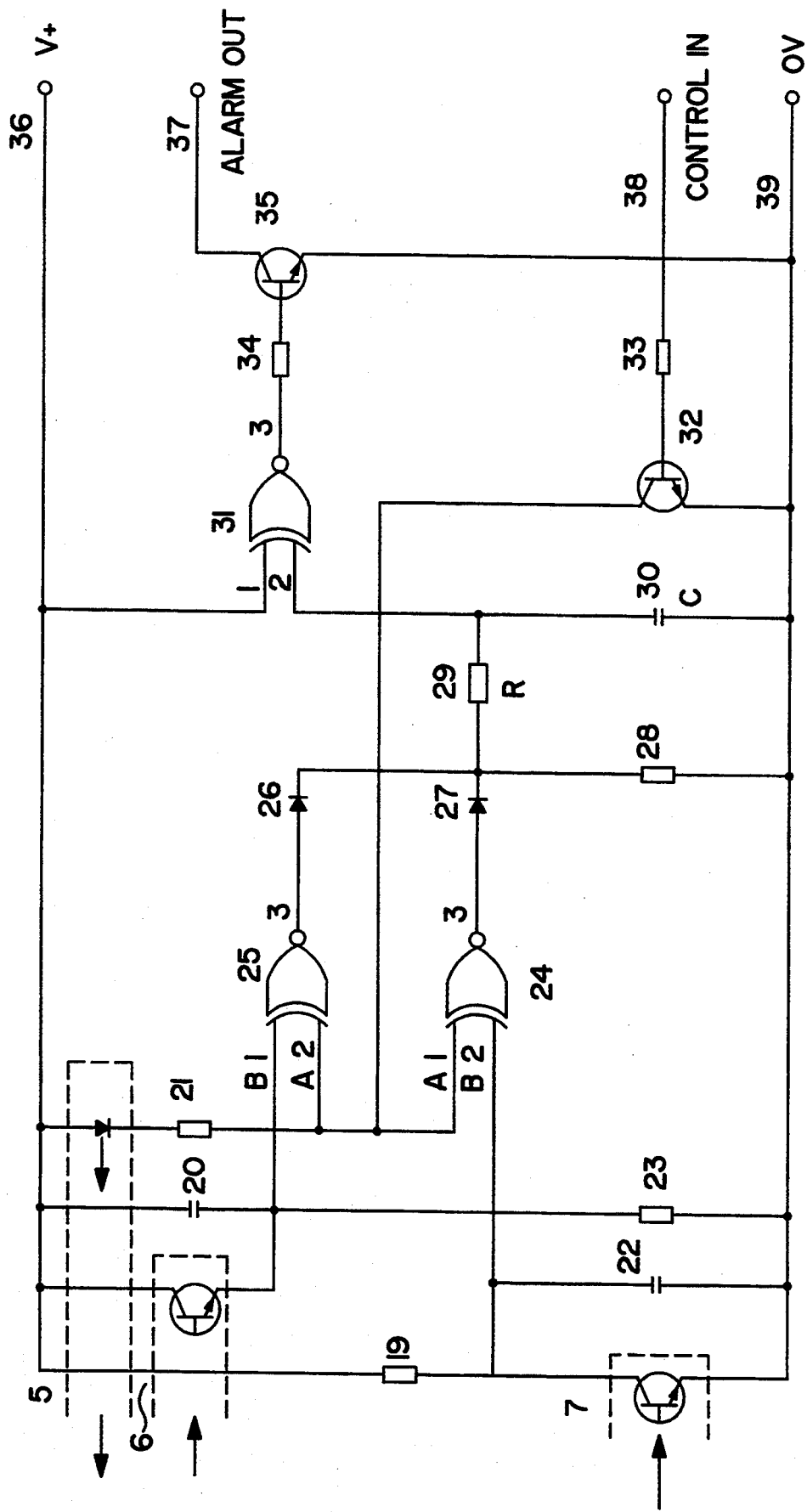
FIG. 3 is a circuit diagram showing an example of the control circuit useful in this invention.

FIG. 3 is a circuit diagram showing an example of a control circuit useful in this invention. The optical switches in this diagram constitute the connection link between this circuit and the circuit described in connection with FIG. 1 and FIG. 2. In the circuit of FIG. 3 a transistor 32 will activate optical switch 5 (or 105) through resistor 21 when a control voltage is present at the control input terminal 38. This is because a positive-voltage signal at the control input terminal 28 will render transistor 32 conducting, so that the resulting current through resistor 21 (caused by the voltage V+ at terminal 36) passes current through the input of optical switch 5 (or 105). At the same time the current through resistor 21 causes the potential of inputs A2 to exclusive NOR gate 25 and A1 to exclusive NOR gate 24 to fall below V+, so that one input at each of exclusive NOR gates 24 and 25 is changed from high to low. The aforementioned activation of optical switch 5 (or 105) will force the output circuit (of FIG. 1 or FIG. 2) into the conducting state, as described hereinbefore with reference to FIGS. 1 and 2. As a result thereof, optical switch 7 (or 107) will be disactivated, since no voltage exists across output terminals 40,41 as described hereinbefore with respect to FIGS. 1 and 2. Optically insulated switch 6 (or 106) will be activated by the current flowing into the control terminal 50 (or 53,54) of the output switch 1 (or 8,9), as described hereinbefore with reference to FIGS. 1 and 2. This means that input B of exclusive NOR gates 24 and 25 will change status from low to high and thereby the output voltage from gates 24 and 25 will be zero. Exclusive NOR gate 31 will also have zero volts output and the alarm output 37 will not be active.

The foregoing describes the state of affairs when the output circuit is activated by closing the output switch 1 (or 8,9) by imparting a signal to the control input 38.

If, under these conditions, the current in the output power switch 1 (or 8,9), described in connection with FIGS. 1 and 2, is interrupted, either by reason of failure of the source voltage or by disconnection of the load, optically insulated switch 6 (or 106) will disactivate and input B of gate 25 will change from high to low, which will change the output of gate 25 to a high voltage. This voltage will charge capacitor 30 through resistor 29. After approximately 50 milliseconds the voltage of capacitor 30 has reached a value approximately 50% of V+, which will make gate 31 change output state. As a consequence of this change of output state, current will flow through resistor 34 into the base of transistor 35, thus activating the alarm output 37. The alarm output will be active as long as the erroneous condition persists.

Let it now be assumed that the error has been corrected, and that the voltage at the control input 38 is removed. In short, the main power switch is turned off. Under these conditions, insulated switch 5 (or 105) will be disactivated and input A at gates 24 and 25 will change to a high voltage since it is no longer grounded through transistor 32. At the same time, optically insulated switch 6 (or 106) will be disactivated, since no control current is flowing to the output power switch as described in connection with FIGS. 1 and 2. Furthermore, optically insulated switch 7 (or 107) will be activated, since there will be voltage across the output terminals 40,41, as described in connection with FIGS. 1 and 2. This means that the voltage at input B of gates 24 and 25 will change to a low voltage, so that gates 24 and 25 will have low output voltage. Consequently, the alarm output will not be activated, because input 2 to the exclusive NOR gate 31 has low input voltage, so that exclusive NOR gate 31 will also have zero volts output.

If, with the main power switch thus "off", the voltage across output terminals 40,41 is disconnected, either by failure of the source voltage or interruption of the load circuit, optically insulated switch 7 (or 107) will be disactivated, and input B of gate 24 will change to a high, which will change the output of gate 24 to high and capacitor 30 will be charged through diode 27 and resistor 29 until the voltage across the capacitor 30 has reached approximately 50% of the supply voltage V+, at which point gate 31 will turn on transistor 35 through resistor 34 and thus turn the alarm output on.

FIG. 4 shows a circuit diagram for an application example of this invention. The function of the circuit of FIG. 4 will now be explained.

Let it be assumed that the voltage source 51 is the mains voltage. When switch 5 (or 105) is closed, the output power switch 1 (or 8,9) of this invention is turned on, as explained in connection with FIGS. 1 and 2, and current will flow from the voltage source 51 to the load 52. When switch 5 (or 105) is again opened, the output power switch of this invention will turn off the said current.

If, with switch 5 (or 105) open, the source voltage 51 is switched off, or the load circuit 52 fails so as to constitute an open circuit, or the output power switch 1 (or 8,9) of this invention fails so as to produce a short circuit, then the alarm output 37 will be activated as explained in connection with FIGS. 1, 2 and 3.

If, with switch 5 (or 105) closed, the source voltage 51 is switched off, or the load circuit 52 fails so as to constitute an open circuit, or the output power switch 1 (or 8,9) of this invention fails either so as to constitute an open circuit or a short circuit and thereby opens the fuse 60, then the alarm output will be activated as explained in connection with FIGS. 1, 2 and 3.

Figure 5:
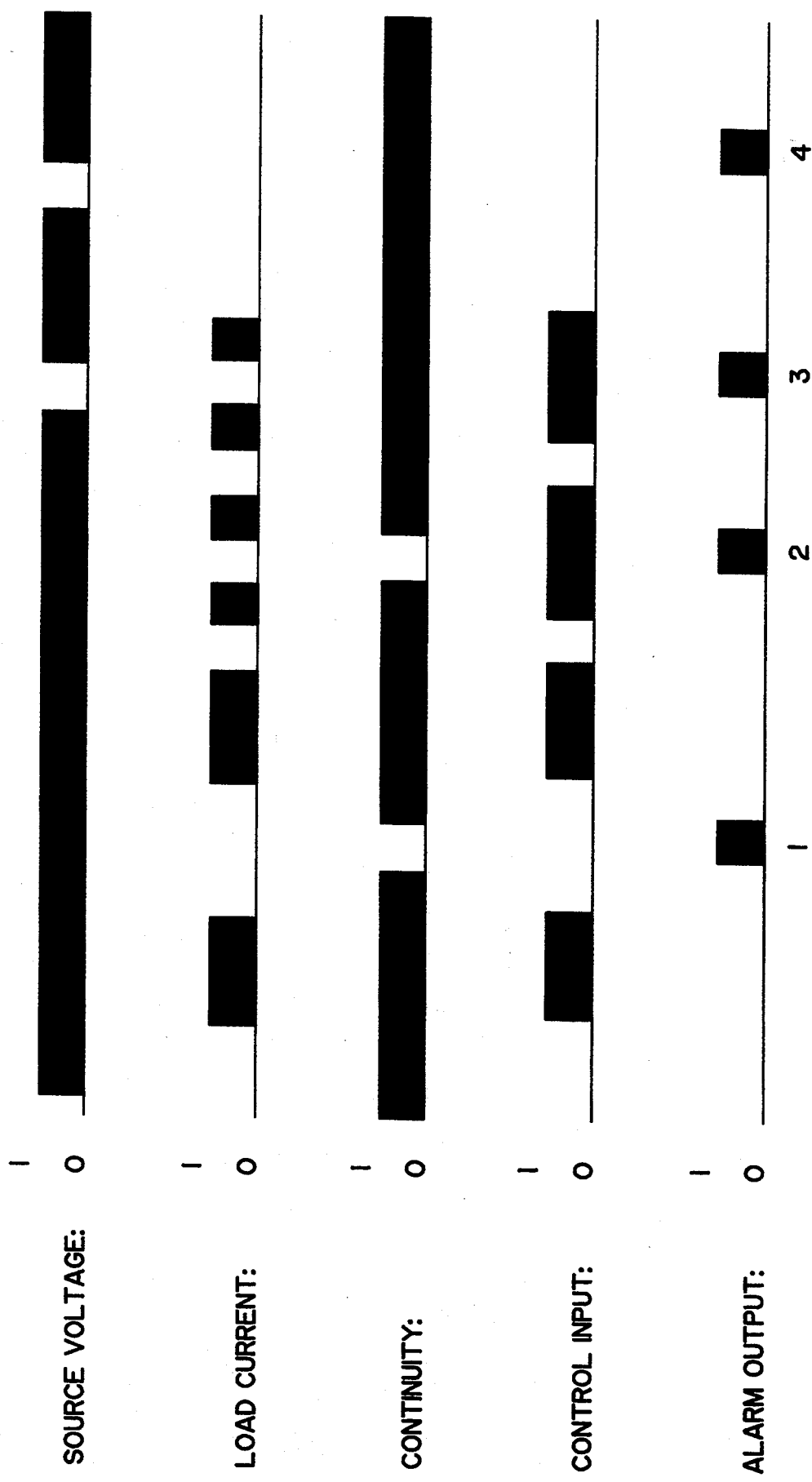
FIG. 5 is a functional diagram for the application example of FIG. 4.

FIG. 5 is a functional diagram for the application example of FIG. 4. This diagram will now be explained.

The first line of FIG. 5 shows the status, as a function of time, of the source voltage 51. During the interval shown by the bar, the source is on; during each of the spaces in the bar the source is off. The second line of FIG. 5 shows the status, as a function of time, of the load current. During the interval shown by the bar, there is a load current. During each of the spaces in the bar the load current is interrupted. The third line of FIG. 5 shows the continuity of the load circuit 52 and the fuse 60. During the interval shown by the bar, there is continuity: i.e., there are no breaks in the load line. During each of the spaces in the bar there is a discontinuity in the load line causing an open circuit. The fourth line of FIG. 5 shows the status, as a function of time, of the control input voltage at 38. During the interval shown by the bar, there is a control input voltage at 38. During each of the spaces there is no the control input voltage at 38. The fifth line of FIG. 5 shows the status, as a function of time, of the alarm output. During the intervals shown by the bar segments there is an alarm output. During each of the spaces between the bar intervals there is no alarm output.

In the fifth line of FIG. 5 the alarm instances are identified by the numerals 1-4. Alarm instances numbered 1 and 2 result because the continuity of either the load or the load connections has been interrupted. Alarm instances numbered 3 and 4 result because the source voltage has failed. Thus, alarm instances numbered 1 and 2 correspond to the spaces in the bar of the third line, and alarm instances correspond to the spaces in the bar of the first line. It should be noted that the mere absence of load current does not necessarily mean a fault.

It will be recalled that the effect of the optical switch 6 is to activate the switch output when current flows in either direction through the switch input, which in turn puts V+ onto input B1 of gate 25. Such current flows when the power output switch 1 is closed. Under these conditions, no current flows through the switch input of the optical switch 7, the switch output of the optical switch 7 is therefore not activated, and so V+ also appears at input B2 of gate 24.

It will also be recalled that the effect of the optical switch 7 is to activate the switch output when current flows in either direction through the switch input, which in turn grounds input B2 of gate 24. Such current flows when the power output switch 1 is open. Under these conditions, no current flows through the switch input of the optical switch 6, the switch output of optical switch 7 is therefore deactivated, and so input B1 of gate 25 is also grounded.

Figure 6:
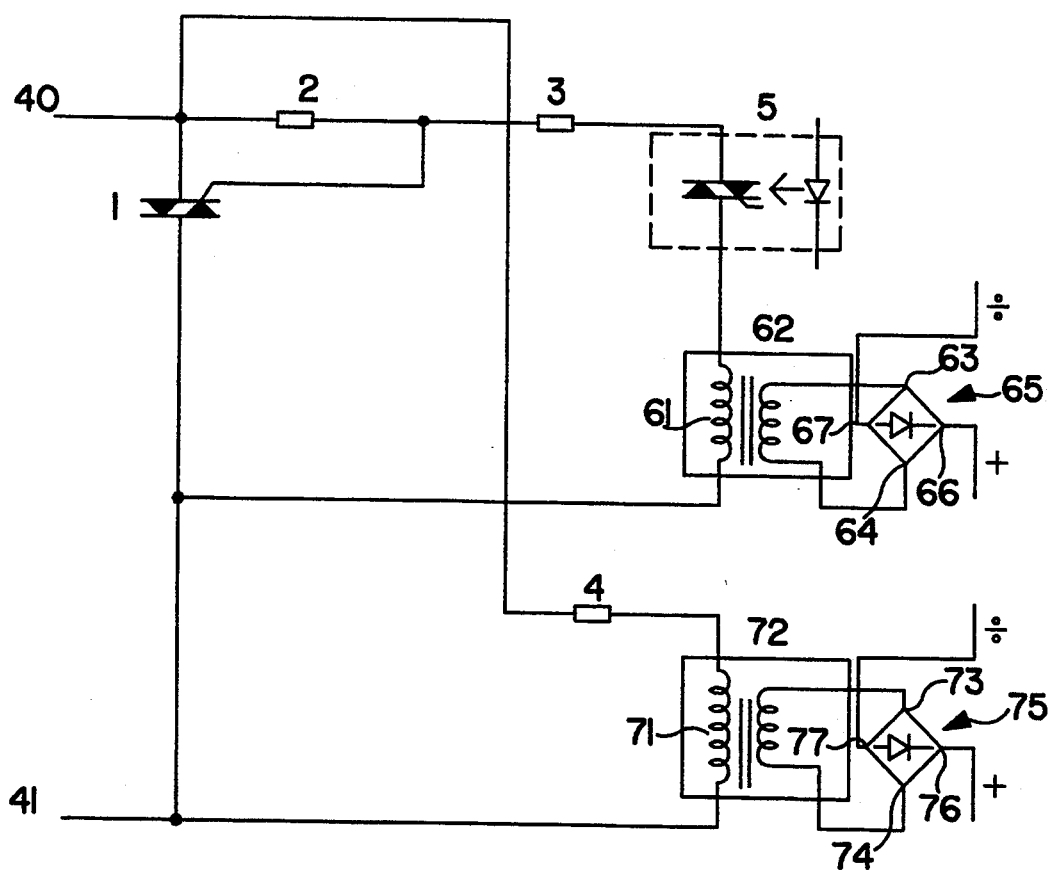
FIG. 6 is a circuit diagram similar to that of FIG. 1 but showing transformer insulation.
Figure 7:
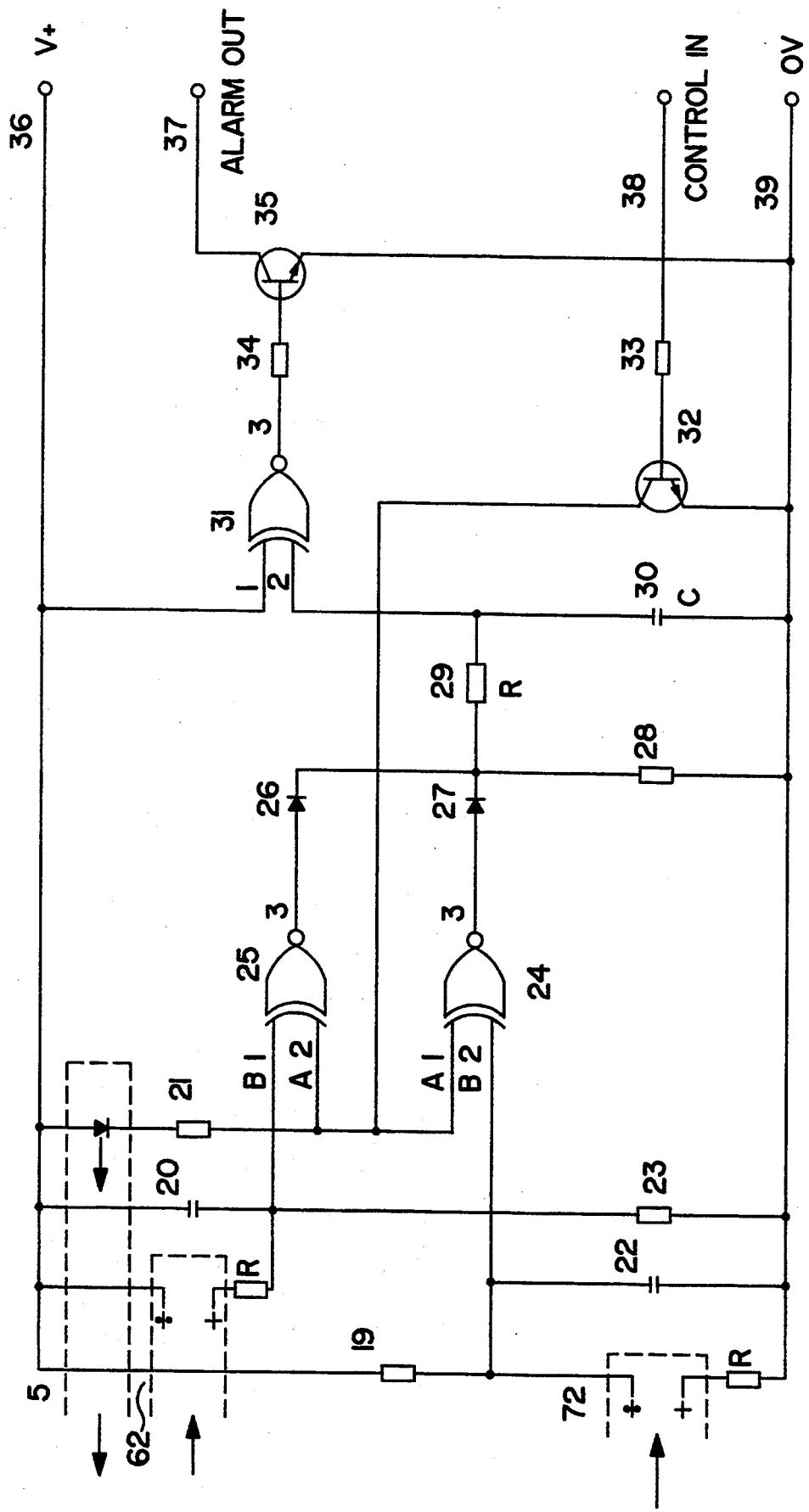
FIG. 7 is a circuit diagram similar to that of FIG. 3 but showing transformer insulation.
Figure 8:
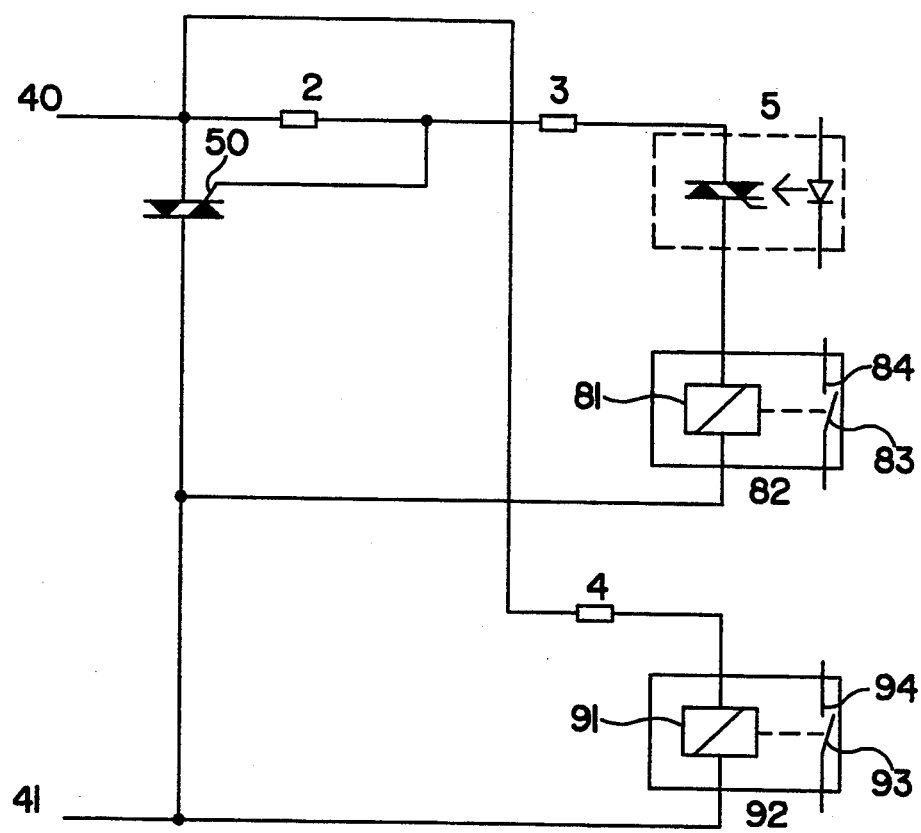
FIG. 8 is a circuit diagram similar to that of FIG. 1 but showing reed-relay insulation.
Figure 9:
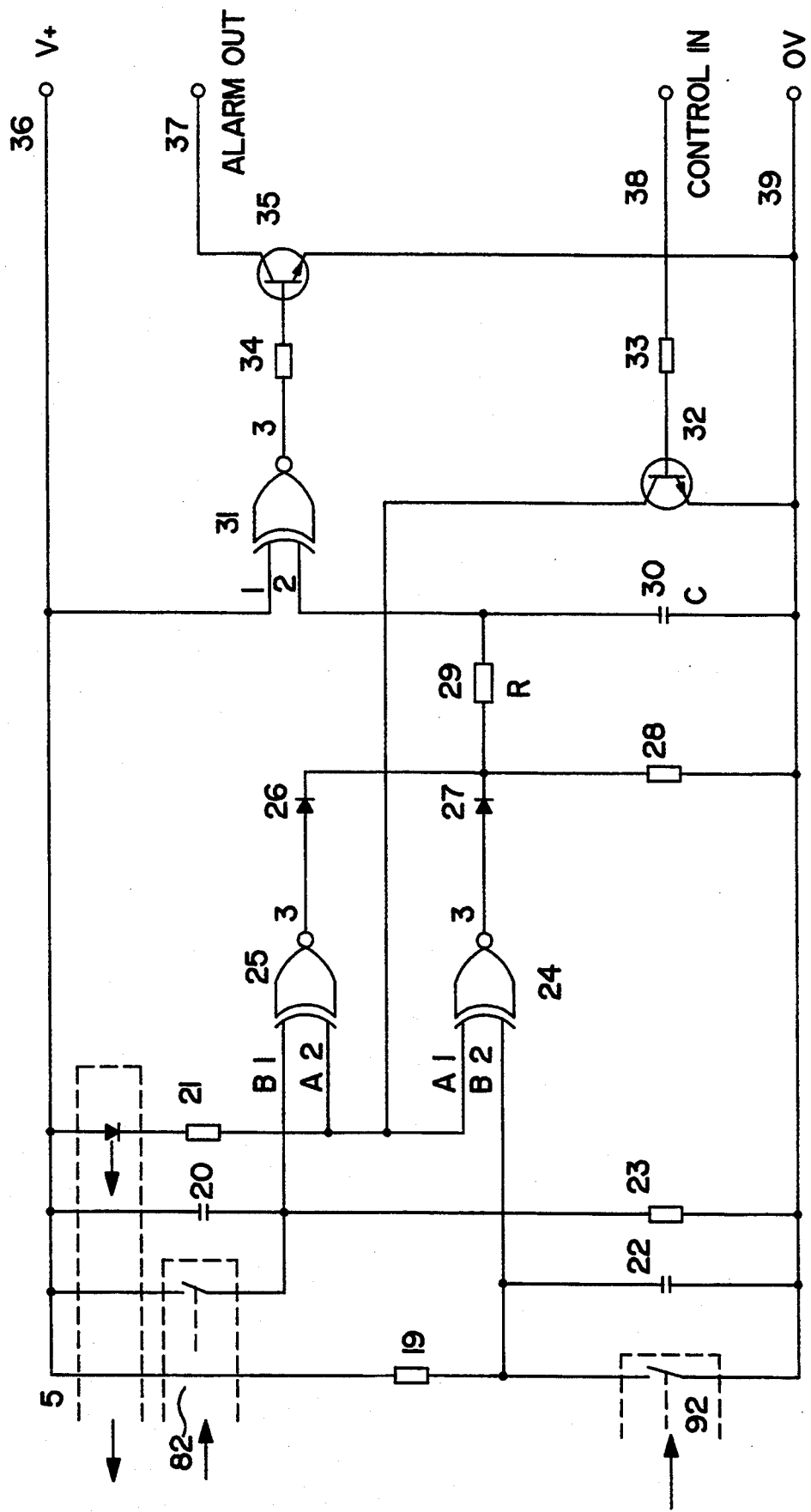
FIG. 9 is a circuit diagram similar to that of FIG. 3 but showing reed-relay insulation.

In each case, the effect of the optical switch is to cause an alternating current through its input to close a switch at its output. Each such optical switch may be replaced by a transformer and bridge rectifier combination, as shown in FIGS. 6 and 7. Alternatively, each such optical switch may be replace by a reed relay as shown in FIGS. 8 and 9. Referring to FIGS. 6 and 7, an alternating current through the primary 61 of transformer 62 produces an alternating current at the AC terminals 63,64 of the bridge rectifier 65, resulting in a DC current flow through the DC terminals 66,67, so that the voltage V+ is applied to the input B1 of gate 25. Similarly, an alternating current through the primary 71 of transformer 72 produces an alternating current at the AC terminals 73,74 of the bridge rectifier 75, resulting in a DC current flow through the DC terminals 76,77, so as to ground the input B2 of gate 24.

Referring to FIGS. 8 and 9, an alternating current through the input 81 of a reed relay 82 pulls the reed 83 of the relay 82 against the contact 84, resulting in a DC current flow through the relay 82, so that the voltage V+ is applied to the input B1 of gate 25. Similarly, an alternating current through the input 91 of a reed relay 92 pulls the reed 93 of the relay 92 against the contact 94, resulting in a DC current flow through the relay 92, so as to ground the input B2 of gate 24.

Having thus described the principles of the invention, together with several illustrative embodiments thereof, it is to be understood that although specific terms are employed, they are used in a generic and descriptive sense, and not for purposes of limitation, the scope of the invention being set forth in the following claims.

I claim:

1. In a solid state relay having a relay control input (38) and a power output switch (1; 8,9) activatable by a control current or a control voltage, said power output switch being open or closed depending upon a control signal applied to said relay control input (38), a first sensing circuit (6) integrated with the relay and sensing the control current or the control voltage received by the power output switch (1; 8,9), a second sensing circuit (7) sensing the voltage applied to the power output switch (1; 8,9), and an evaluation circuit (24,25,26,27,28,29,30,31) connected with said first sensing circuit (6) and said second sensing circuit (7), which delivers an alarm signal as may be required.

2. Solid state relay according to claim 1, wherein the evaluation circuit (24,25,26,27,28,29,30,31) is connected with the relay control input (38).

3. Solid state relay according to claims 1 or 2, wherein the first sensing circuit contains an optically coupled and galvanically isolated circuit (6).

4. Solid state relay according to claims 1 or 2, wherein the second sensing circuit contains an optically coupled and galvanically isolated circuit (7).

5. Solid state relay according to claims 1 or 2, wherein the first sensing circuit contains a magnetically coupled and galvanically isolated circuit.

6. Solid state relay according to claims 1 or 2, wherein the second sensing circuit contains a magnetically coupled and galvanically isolated circuit.

7. Solid state relay according to claims 1 or 2, wherein the evaluation circuit contains a first exclusive-NOR-gate (24) and a second exclusive-NOR-gate (25) connected in parallel with said first exclusive-NOR-gate (24), the output of said second exclusive-NOR-gate (25) being connected with the output of said first exclusive-NOR-gate (24).

8. Solid state relay according to claim 7, wherein the common output of the exclusive-NOR-gates (24,25) is connected with an integrating RC-member (29,30).

9. A solid state relay having a relay control input and a power output switch and being able to monitor line and load conditions comprising, in combination, a solid state relay having a sensing circuit integrated into said relay, said sensing circuit including an optically insulated switch for sensing the control current of the output power switch, and an optically insulated switch for sensing the voltage across the output power semiconductor, means for comparing two or more of the three parameters consisting of said sensed current and said sensed voltage and the control input, and an alarm output.

10. A solid state relay having a relay control input and a power output switch and being able to monitor line and load conditions comprising, in combination, a solid state relay having a sensing circuit integrated into said relay, said sensing circuit including a magnetically coupled insulator for sensing the control current of the output power switch, and a magnetically coupled insulator for sensing the voltage across the output power semiconductor, means for comparing two or more of the three parameters consisting of said sensed current and said sensed voltage and the control input, and an alarm output.

11. Solid state relay according to claim 3, wherein the second sensing circuit contains an optically coupled and galvanically isolated circuit (7).

12. Solid state relay according to claim 3, wherein the evaluation circuit contains a first exclusive-NOR-gate (24) and a second exclusive-NOR-gate (25) connected in parallel with said first exclusive-NOR-gate (24), the output of said second exclusive-NOR-gate (25) being connected with the output of said first exclusive-NOR-gate (24).

13. Solid state relay according to claim 4, wherein the evaluation circuit contains a first exclusive-NOR-gate (24) and a second exclusive-NOR-gate (25) connected in parallel with said first exclusive-NOR-gate (24), the output of said second exclusive-NOR-gate (25) being connected with the output of said first exclusive-NOR-gate (24).

14. Solid state relay according to claim 5, wherein the evaluation circuit contains a first exclusive-NOR-gate (24) and a second exclusive-NOR-gate (25) connected in parallel with said first exclusive-NOR-gate (24), the output of said second exclusive-NOR-gate (25) being connected with the output of said first exclusive-NOR-gate (24).

15. Solid state relay according to claim 6, wherein the evaluation circuit contains a first exclusive-NOR-gate (24) and a second exclusive-NOR-gate (25) connected in parallel with said first exclusive-NOR-gate (24), the output of said second exclusive-NOR-gate (25) being connected with the output of said first exclusive-NOR-gate (24).

* * * * *